US005814430A

United States Patent [19]

Daems et al.

[11] Patent Number: 5,814,430

[45] Date of Patent: Sep. 29, 1998

[54] METHOD FOR THE FORMATION OF AN IMPROVED HEAT MODE IMAGE

[75] Inventors: Eddie Daems, Herentals; Rita Torfs, Herenthout; Luc Leenders, Herentals, all of Belgium

[73] Assignee: AGFA-Gevaert, N.V., Mortsel, Belgium

[21] Appl. No.: 917,287

[22] Filed: Aug. 25, 1997

Related U.S. Application Data

[60] Provisional application No. 60/031,303 Nov. 19, 1996.

[30] Foreign Application Priority Data

Sep. 23, 1996 [EP] European Pat. Off. .............. 96202650

[51] Int. Cl.[6] .............................. G03C 8/08; G03C 8/40; G03F 7/36

[52] U.S. Cl. .......................... 430/200; 430/201; 430/203

[58] Field of Search .................................... 430/200, 201, 430/203

[56] References Cited

U.S. PATENT DOCUMENTS

| | | | |
|---|---|---|---|
| 5,360,781 | 11/1994 | Leenders et al. | 430/200 |
| 5,506,085 | 4/1996 | Marc Van Damme et al. | 430/200 |
| 5,595,854 | 1/1997 | Leenders et al. | 430/200 |
| 5,629,130 | 5/1997 | Leenders et al. | 430/200 |

FOREIGN PATENT DOCUMENTS

| | | |
|---|---|---|
| 0 582 001 A1 | 2/1994 | European Pat. Off. . |
| 0 644 060 A1 | 3/1995 | European Pat. Off. . |
| 0 674 217 A1 | 9/1995 | European Pat. Off. . |
| WO 90/12342 | 10/1990 | WIPO . |
| WO 95/07822 | 3/1995 | WIPO . |

*Primary Examiner*—Richard L. Schilling
*Attorney, Agent, or Firm*—Breiner & Breiner

[57] ABSTRACT

A method is disclosed for the formation of a heat mode image with good differentiation between Dmin and Dmax. The method essentially comprises information-wise laser exposure of a layer pack comprising a layer containing a reducing agent, a barrier layer, and a layer containing a reducible organic metal salt, preferably silver behenate. The barrier layer is destructible by laser radiation and allows transfer of reducing agent in the exposed parts while no such transfer occurs in the unexposed parts. Preferably, an overall heat post-treatment is given. A mono-sheet and a two-sheet version of the invention are described.

22 Claims, No Drawings

METHOD FOR THE FORMATION OF AN IMPROVED HEAT MODE IMAGE

The application claims benefit of US Provisional Application No. 60/031,303 filed November 19, 1996.

DESCRIPTION

1. Field of the Invention

The present invention relates to a method for obtaining a heat mode image with improved storage properties, and to a corresponding thermal imaging medium.

2. Background of the Invention

Conventional photographic materials based on silver halide are used for a large variety of applications. For instance, in the pre-press sector of graphic arts rather sensitive camera materials are used for obtaining screened images. Scan films are used for producing colour separations from multicolour originals. Phototype setting materials record the information fed to phototype- and image setters. Relative insensitive photographic materials serve as duplicating materials usually in a contact exposure process. Other fields include materials for medical recording, duplicating and hard copy, X-ray materials for non-destructive testing, black-and-white and colour materials for amateur- and professional still photography and materials for cinematographic recording and printing.

Silver halide materials have the advantage of high potential intrinsic sensitivity and excellent image quality. On the other hand they show the drawback of requiring several wet processing steps employing chemical ingredients which are suspect from an ecological point of view.

In the past several proposals have been made for obtaining an imaging element that can be developed using only dry development steps without the need of processing liquids as it is the case with silver halide photographic materials.

A dry imaging system known since quite a while is 3M's dry silver technology. It is a catalytic process which couples the light-capturing capability of silver halide to the image-forming capability of organic silver salts. Traditionally, silver halide, preferably silver bromide, is formed in situ by reacting silver behenate with bromide ions. The result of this process is the formation of very fine grains of silver bromide, less than 500 angstroms in diameter and positioned in catalytic proximity to the silver behenate. Exposure to light causes photolytic reduction at the silver bromide crystal (latent image formation) and provides a catalyzes the reduction of the organic silver salt to silver metal at an elevated temperature thus producing a visual density. A disadvantage of this technology is that in the non-exposed areas silver halide remains which forms print-out silver on aging thereby increasing the minimal density eventually to an unacceptable level for some purposes. Details on the dry silver technology can be found in U.S. Pat. Nos. 3,457,075, 3,839,049, 4,260,677 and *J. Phot. Sci.,* Vol. 41 (1993), p. 108.

Another type of non-conventional materials as alternative for silver halide is based on photopolymerisation. The use of photopolymerizable compositions for the production of images by information-wise exposure thereof to actinic radiation is known since quite a while. All these methods are based on the principle of introducing a differentiation in properties between the exposed and non-exposed parts of the photopolymerizable composition e.g. a difference in solubility, adhesion, conductivity, refractive index, tackiness, permeability, diffusibility of incorporated substances e.g. dyes etc.. The thus produced differences may be subsequently employed in a dry treatment step to produce a visible image and/or master for printing e.g. a lithographic or electrostatic printing master.

As a further alternative for silver halide chemistry dry imaging elements are known that can be image-wise exposed using an image-wise distribution of heat. When this heat pattern is applied directly by means of a thermal head such elements are called thermographic materials. When the heat pattern is applied by the transformation of intense laser light into heat these elements are called heat mode materials or thermal imaging media. They offer the additional advantage compared to most photo mode systems that they do not need to be handled in a dark room nor is any other protection from ambient light needed.

Heat mode recording materials, based on change of adhesion, are disclosed in e.g. U.S. Pat. Nos. 4,123,309, 4,123,578, 4,157,412, 4,547,456 and PCT publ. Nos. WO 88/04237, WO 93/03928, and WO 95/00342. In a preferred embodiment such a thermal imaging medium comprises a transparent support and an imaging layer containing carbon black, optionally additional layers and a stripping sheet. By the conversion of intense laser light into heat on information-wise exposure a surface part of the support liquefies and firmly locks the carbon black, so that after delamination a negative carbon black image is formed on the support.

In still another type of heat mode recording materials information is recorded by creating differences in reflection and/or in transmission optical density on the recording layer. The recording layer has high optical density and absorbs radiation beams which impinge thereon. The conversion of radiation into heat brings about a local temperature rise, causing a thermal change such as evaporation or ablation to take place in the recording layer. As a result, the irradiated parts of the recording layer are totally or partially removed, and a difference in optical density is formed between the irradiated parts and the unirradiated parts (cf. U.S. Pat. Nos. 4,216,501, 4,233,626, 4,188,214 and 4,291,119 and British Pat. No. 2,026,346). The recording layer of such heat mode recording materials is usually made of metals, dyes, or polymers.

In other heat mode image forming systems based on ablation the recorded image is transferred to an acceptor sheet. As a consequence such an acceptor must be applied by lamination before the recording step, as disclosed e.g. in U.S. Pat. No. 4,245,003.

In still another type of thermographic and heat mode elements density is generated by image-wise chemical reduction of organic metal salts, preferably silver salts such as silver behenate, without the presence of catalytic amounts of exposed silver halide such it is the case in the dry silver system. For instance, in EP 0 674 217 a method is disclosed for the formation of a heat mode image comprising the steps of:

(1) preparing a donor element by coating on a support one or more donor layers containing, distributed over said one or more layers, a reducing agent, a radiation to heat converting compound, and optionally a polymeric binder;

(2) preparing an acceptor element by coating on a support an acceptor layer containing a reducible organic silver salt and a polymeric binder;

(3) bringing said donor layer and said acceptor layer in close contact with each other;

(4) information-wise exposing the contacting elements with laser radiation, thus inducing the partial or complete transfer of said donor layer(s) to the acceptor element and/or diffusion of said reducing agent into the acceptor element;

(5) peeling apart the donor and acceptor elements;

Preferably the separated acceptor element is subjected to an overall heat treatment.

A disadvantage of the cited invention lies in the fact that the obtainable density and the sharpness of the obtained image are mediocre. An optional mono-sheet version of the described invention on the other hand would show problems with a rather limited shelf life.

The present invention extends the teachings on the formation of heat mode images based on the reduction of organic metal salts, and constitutes an improvement to the teachings of EP 0 674 217, cited above.

It is an object of the present invention to provide a method, and a corresponding material, for the formation of a heat mode image involving only dry processing steps.

It is a further object of the present invention to provide a method for the formation of a heat mode image with a good differentiation between minimum and maximum density.

It is still a further object of the present invention to provide a method for the formation of a heat mode image using a thermal imaging medium with an improved shelf life.

It is still a further object of the present invention to provide a method for the formation of a heat mode image with good sharpness.

3. Summary of the Invention

In a first embodiment (mono-sheet version), the objects of the present invention are realised by providing a method, and a corresponding material, for obtaining a heat mode image comprising the following steps:

(A) exposing information-wise to laser radiation a thermal imaging medium comprising the following layers:
 (1) a transparent support, optionally subbed,
 (2) a layer comprising a reducing agent and a binder,
 (3) a barrier layer destructible by heat and preventing the diffusion of said reducing agent to following layer (4) before said laser exposure, and comprising a compound capable of converting laser radiation to heat,
 (4) a layer containing a reducible organic metal salt, a binder and optionally a toning agent, said laser exposure inducing in the exposed parts destruction of said barrier layer (3) and at least partial transfer of said reducing agent of layer (2) into said layer (4), while no destruction and no transfer occur in the unexposed parts, and (B) optionally subjecting said exposed thermal imaging medium to an overall heat treatment.

In a second embodiment (two-sheet version) the objects of the present invention are realized by providing a method for obtaining a heat mode image comprising the following steps:

(A') exposing information-wise to laser radiation an acceptor element comprising the following layers:
 (1') a temporary transparent support, optionally subbed,
 (2') a stripping layer pack,
 (3') a layer containing a reducible metal salt, a binder and optionally a toning agent,
 (4') a barrier layer destructible by heat, and comprising a compound capable of converting laser radiation to heat, whereby destruction of said barrier layer occurs in the exposed areas, (B') providing a donor element comprising the following layers:
 (5') a transparent support, optionally subbed,
 (6') a layer containing a reducing agent and a (thermo) adhesive polymer, (C') laminating acceptor element (A') and donor element (B') to each other, layers (4') and (6') facing each other, (D') removing temporary transparent support (1') and at least part of stripping layer pack (2') by delamination, (E') subjecting the resulting layer pack to an overall heat treatment.

In a most preferred embodiment the reducible organic metal salt is silver behenate, the barrier layer comprises nitrocellulose optionally hardened, and the laser exposure is performed by an infra-red laser.

4. Detailed Description of the Invention

Firstly, we shall describe the essential features and ingredients of the different layers of the thermal imaging media of the present invention. Those ingredients are essentially the same both for the mono-sheet version and for the two-sheet version.

A transparent organic resin support can be chosen from, e.g., cellulose nitrate film, cellulose acetate film, polyvinyl acetal film, polystyrene film, polyethylene terephthalate film, polycarbonate film, polyvinylchloride film or poly-α-olefin films such as polyethylene or polypropylene film. The thickness of such organic resin film is preferably comprised between 0.05 and 0.35 mm. These organic resin supports are preferably coated with a subbing layer. The most preferred transparent support is a polyethylene terephthalate support. An example of a suitable subbing layer is a layer containing a polymer containing covalently bound chlorine. Suitable chlorine containing polymers are e.g. polyvinyl chloride, polyvinylidene chloride, a copolymer of vinylidene chloride, an acrylic ester and itaconic acid, a copolymer of vinyl chloride and vinylidene chloride, a copolymer of vinyl chloride, vinylidene chloride and itaconic acid, a copolymer of vinyl chloride, vinyl acetate and vinyl alcohol, A preferred chlorine containing polymer is co(vinylidenechloride-methylacrylate-itaconic acid; 88%/10%/2%). A most suitable subbing layer contains the latter polymer and a colloidal silica such as KIESELSOL 100F (Bayer AG).

An alternative option for the transparent support is a thin glass support.

Suitable reducing agents for use in the layers (2) or (6') include pyrogallol, 4-azeloyl-bis-pyrogallol, 4-stearyl pyrogallol, galloacetophenone, di-tertiary-butyl pyrogallol, gallic acid anilide, methyl gallate, sodium gallate, ethyl gallate, normal- and iso-propyl gallate, butyl gallate, dodecyl gallate, gallic acid, ammonium gallate, ethyl protocatechuate, cetyl protocatechuate, 1-hydroxy-2-naphthoic acid, 2-hydroxy-3-naphthoic acid, phloroglucinol, catechol, 2,3-naphthalene diol, 4-lauroyl catechol, protocatechualdehyde, 4-methyl esculetin, 3,4-dihydroxy benzoic acid and its esters, 2,3-dihydroxy benzoic acid and its esters, 2,5-dihydroxy-benzoic acid and its esters, hydroquinone, t.-butylhydroquinone, isopropylhydroquinone, 2-tetrazolylthiohydroquinonens, e.g., 2-methyl-5-(1-phenyl-5-tetrazolylthio)hydroquinone, 5-pyrazolones, 3-pyrazolones, 4,4'-dihydroxy-biphenyl, bis (2-hydroxy-3-t.-butyl-5-methylphenyl)methane, 2,2-bis(4-hydroxy-3-methylphenyl)propane, 4,4-ethylidene-bis(2-t.-butyl-6-methylphenol), 2,2-bis(3,5-dimethyl-4-hydroxyphenyl)propane, ascorbic acid and its derivatives, 3,4-dihydroxyphenylacetic acid, 4-(3',4'-dihydroxyphenylazo)benzoic acid, 2,2'-methylene-bis-3,4,5-trihydroxybenzoic acid, ortho-, meta- and para-phenylenediamine, tetramethyl benzidine, 4,4',4"-diethylamino-triphenylmethane, o-, m-, and p-aminobenzoic acid, 4-methoxy-1-hydroxy-dihydronaphthalene and tetrahydroquinoline. Further useful reducing agents comprise aminocycloalkenone compounds, esters of amino reductones, N-hydroxyurea derivatives, hydrazones of aldehyde and ketones, phosphoramidophenols, phosphor amidoanilines, (2,5-dihydroxyphenyl)sulphone, tetrahydroquinoxalines, 1,2,3,4-tetrahydroquinoxaline, amidoximes, azines, hydroxamic acids, sulphonamidophenols, 2-phenylindane-1,3-dione, 1-4-dihydropyridines, such as 2,6-dimethoxy-3,5-dicarbethoxy-1,4-dihydropyridine. Still other useful reducing agents include resorcins, m-aminophenols, α- and β-naphtols, alkylphenols and alkoxynaphtols. A further class of reducing agents is constituted by hydrazine compounds. Especially preferred hydrazine compounds include p-tolylhydrazine hydrochloride, N,N-phenylformylhydrazide, acetohydrazide, benzoylhydrazide, p-toluenesulphonylhydrazide, N,N'-diacetylhydrazine, β-acetyl-phenylhydrazine, etc.

Another possible reducing agent is "Spirana", a spiro-bis-indane derivative, disclosed in EP 0 599 369, and corresponding to following chemical formula:

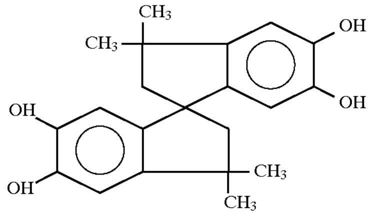

The most preferred reducing agent for the practice of this invention are esters of gallic acid, especially ethyl gallate and dodecyl gallate.

The barrier layer (2) or (4') is destructible by the heat converted from laser radiation in the sense that its binder is ablatable or decomposable. The term decomposable binder as used here means a binder that thermally decomposes thereby rapidly giving rise to significant amounts of gases and volatile fragments at temperatures achieved during laser imaging. The polymeric binders that can be used in the barrier layer include cellulosic derivatives, e.g. cellulose nitrate, cellulose acetate, cellulose acetate propionate, cellulose acetate butyrate, cellulose triacetate, ethyl cellulose ether, etc.; furtheron polycarbonates, polystyrene, polyurethanes, poly(vinyl acetate), poly(vinyl acetal), copoly(styrene-acrylonitrile) and, poly(ethylene oxide).

A most preferred polymeric binder is cellulose nitrate (commonly termed nitrocellulose). This nitrocellulose can be unhardened, but, especially in the mono-sheet version, it is preferred to use a barrier layer containing a hardened nitrocellulose. This has several advantages. First of all, the barrier properties of the layer, being the prevention of reducing agent transfer before laser exposure or in the unexposed areas, are improved resulting in a better shelf life. Furthermore, the next layer (4) will be more easily coatable on it without danger for layer intermixing. The hardening is performed by cross-linking the free hydroxyl groups of the nitrocellulose by chemical reaction with e.g. isocyanates, phenols, dialdehydes, epoxy compounds, and melamines. The cross-linking is performed by an overall heat treatment. A preferred way of obtaining a hardened nitrocellulose is combining it in the coating solution of the barrier layer with hexamethylenediisocyanate (such as DESMODUR N75 from Bayer AG) and zinc octanoate, which acts as a catalyst, and subjecting the coated barrier layer to heat curing. In the case of the two-sheet version the use of a hardened nitrocellulose is not so stringent, and simply the use of unhardened nitrocellulose will be satisfactory in most cases.

Another important ingredient of the barrier layer is the radiation to heat converting substance that transforms the information-wise modulated laser radiation into an information-wise modulated pattern of heat. In a most preferred embodiment the laser is an infra-red laser like a diode laser or a NdYAG laser and the radiation to heat converting substance is an infra-red absorbing compound. Infra-red absorbing compounds, absorbing above 700 nm, are known since a long time and belong to several different chemical classes, e.g. indoaniline dyes, oxonol dyes, porphine derivatives, anthraquinone dyes, merostyryl dyes, pyrylium compounds and sqarylium derivatives.

A suitable infra-red dye can be chosen from the numerous disclosures and patent applications in the field, e.g., from U.S. Pat. Nos. 4,886,733, 5,075,205, 5,077,186, 5,153,112, 5,244,771, from Japanese unexamined patent publications (Kokai) No.'s 01-253734, 01-253735, 01-253736, 01-293343, 01-234844, 02-3037, 02-4244, 02-127638, 01-227148, 02-165133, 02-110451, 02-234157, 02-223944, 02-108040, 02-259753, 02-187751, 02-68544, 02-167538, 02-201351, 02-201352, 03-23441, 03-10240, 03-10239, 03-13937, 03-96942, 03-217837, 03-135553, 03-235940, and from the European published patent application No.'s 0 483 740, 0 502 508, 0 523 465, 0 539 786, 0 539 978 and 0 568 022. This list is far from exhaustive and limited to rather recent disclosures.

In a preferred embodiment the infra-red dye is chosen from German patent application DE 43 31 162.

Actual useful infra-red dyes are listed below:

ID-1 is a commercial product known as CYASORB IR165, marketed by American Cyanamid Co, Glendale Protective Technologie Division, Woodbury, N.Y. It is a mixture of two parts of the molecular non-ionic form (ID-1a) and three parts of the ionic form (ID-1b) (see below). The compounds are also available from Bayer AG.

ID-1a

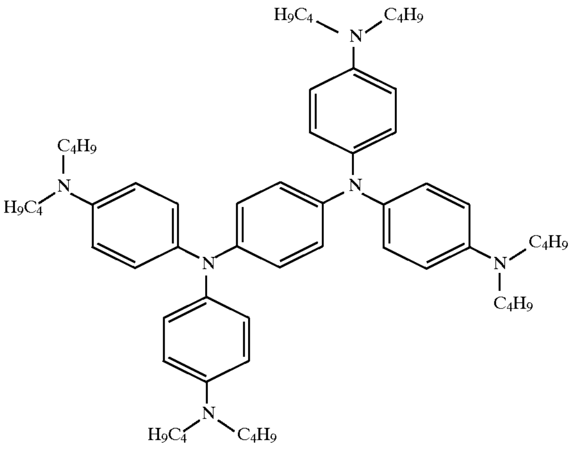

-continued

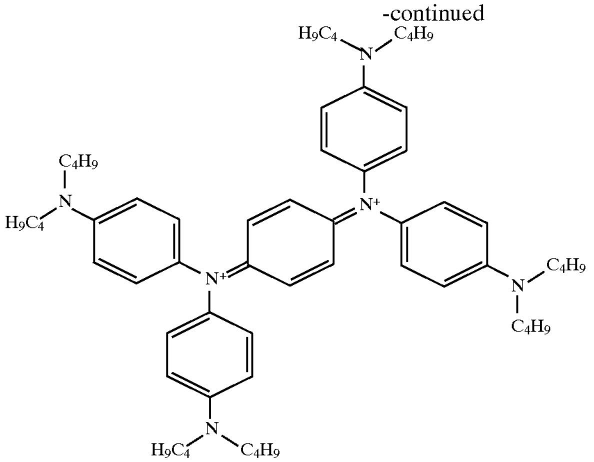

ID-1b

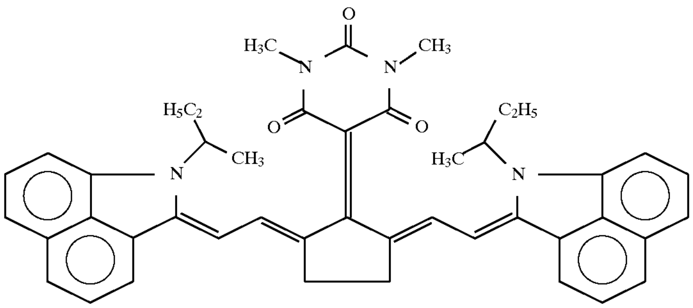

ID-2

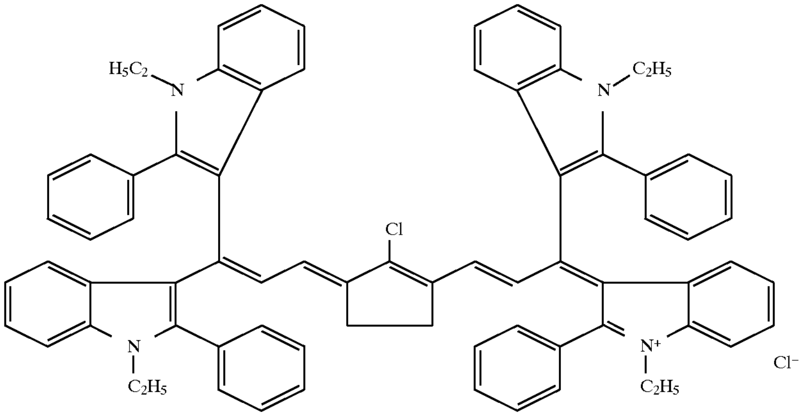

ID-3

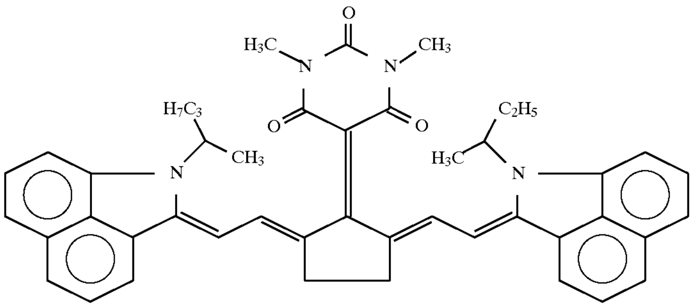

ID-4

Since the infra-red dye is retained in the final heat mode image it must show low side absorptions in the visual and UV spectral regions. For this reason infra-red absorbing pigments such as carbon black cannot be used in the practice of this invention.

The concentration of the infra-red absorbing dye must be chosen so that the optical density at the emission wavelenght of the laser is at least 0.3 and most preferably at least 0.5. So the optimal concentration of the dye is dependent self-evidently on its molar extinction coefficient at this emission wavelength. Also layer compatibility and layer stability are important. The most preferred compounds are the mixture of ID-1a+ID-1*b*.

The total coverage of the barrier layer is preferably comprised between 0.5 and 7 $g/m^2$. When the barrier layer is relatively thick its barrier action is self-evidently stronger, but the laser radiation must be stronger in order to eliminate its barrier function.

The most important ingredient of the layer (4) according to the mono-sheet version, or of the layer (3') according to the two-sheet version is the reducible organic silver salt. Substantially light-insensitive organic silver salts particularly suited for use according to the present invention in the heat-sensitive recording layer are silver salts of aliphatic carboxylic acids known as fatty acids, wherein the aliphatic carbon chain has preferably at least 12 C-atoms, e.g. silver laurate, silver palmitate, silver stearate, silver hydroxystearate, silver oleate and silver behenate. Silver salts of modified aliphatic carboxylic acids with thioether group as described e.g. in GB-P 1,111,492 and other organic silver salts as described in GB-P 1,439,478, e.g. silver benzoate and silver phthalazinone, may be used likewise. Further can be used silver salts of aromatic carboxylic acids (e.g. benzoic acid, phtalic acid, terephtalic acid, salicylic acid, m-nitrobenzoic-, phenylacetic-, pyromellitic-, p-phenylbenzoic-, camphoric-, huroic-, acetamidobenzoic- and o-aminobenzoic acid, etc.). Furtheron can be used silver salts of mercapto group- or thione group-containing compounds (e.g., 3-mercapto-4-phenyl-1,2,4-triazole, 2-mercaptobenzimidazole, etc.) or an imino group-containing compound (e.g. benzotriazole or derivatives thereof as described in GB 1,173,426 and U.S. Pat. No. 3,635,719, etc.). Further can be mentioned silver imidazolates and the substantially light-insensitive organic silver salt complexes described in U.S. Pat. No. 4,260,677.

In a most preferred embodiment of the present invention the organic silver salt is silver behenate. The compound is colourless, visibly stable toward light, insoluble in many volatile liquid vehicles, and moisture-resistant. It is produced in the desired physical form without difficulty and at reasonable cost.

The layers (2) and (4) or (3') contain a binder. Suitable binders include cellulose derivatives, such as ethyl cellulose, hydroxyethyl cellulose, ethylhydroxy cellulose, ethylhydroxyethyl cellulose, hydroxypropyl cellulose, methyl cellulose, cellulose nitrate, cellulose acetate formate, cellulose acetate hydrogen phthalate, cellulose acetate, cellulose acetate propionate, cellulose acetate butyrate, cellulose acetate pentanoate, cellulose acetate benzoate, cellulose triacetate; vinyl-type resins and derivatives, such as polyvinyl alcohol, polyvinyl acetate, polyvinyl butyral, copolyvinyl butyral-vinyl acetal-vinyl alcohol, polyvinyl pyrrolidone, polyvinyl acetoacetal, polyacrylamide; polymers and copolymers derived from (meth)acrylates and (meth)acrylate derivatives, such as polyacrylic acid, polymethyl methacrylate and styrene-acrylate copolymers; polyester resins; polycarbonates; copoly(styrene-acrylonitrile); polysulfones; polyphenylene oxide; organosilicones such as polysiloxanes; epoxy resins and natural resins, such as gum arabic. When using copoly(stryrene-acrylonitrile) the copolymer preferably comprises at least 65% by weight of styrene units and at least 25% by weight of acrylonitrile units, but other comonomers can be present, e.g., butadiene, butyl acrylate and methyl methacrylate.

The most preferred binder for layer (2) containing the reducing agent is polyvinylalcohol. In the two-sheet version layer (6') containing the reducing agent further contains a thermoadhesive polymer which itself functions as a binder and no extra binder is necessary. The most preferred binder for the organic metal salt layer (4) or (3') is polyvinylbutyral, commercially known as BUTVAR, e.g. BUTVAR B79 (Monsanto Co.)

In order to obtain a neutral black image tone in the higher densities and neutral grey in the lower densities the acceptor layer further preferably may contain a so-called toning agent known from thermography or photothermography. The incorporation of a toning agent or toner constitutes an alternative for the use of a reducing agent that upon oxidation forms a coloured compound the colour of which is complementary to the hue of the silver image.

Suitable toning agents are the phthalimides and phthalazinones within the scope of the general formulae described in U.S. Pat. No. Re. 30,107. Further reference is made to the toning agents described in U.S. Pat. Nos. 3,074,809, 3,446,648 and 3,844,797. Other particularly useful toning agents are the heterocyclic toner compounds of the benzoxazine dione or naphthoxazine dione type within the scope of following general formula:

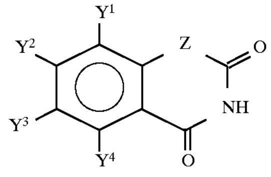

wherein

Z represents O or N-alkyl;

each of $Y^1$, $Y^2$, $Y^3$ and $Y^4$ (same or different) represents hydrogen, alkyl, e.g. $C_1$–$C_{20}$ alkyl, preferably $C_1$–$C_4$ alkyl, cycloalkyl, e.g. cyclopentyl or cyclohexyl, alkoxy, preferably methoxy or ethoxy, alkylthio with preferably up to 2 carbon atoms, hydroxy, dialkylamino of which the alkyl groups have preferably up to 2 carbon atoms or halogen, preferably chlorine or bromine; or $Y^1$ and $Y^2$ or $Y^2$ and $Y^3$ represent the ring members required to complete a fused aromatic ring, preferably a benzene ring, or $Y^3$ and $Y^4$ represent the ring members required to complete a fused-on aromatic or cyclohexane ring. Toners within the scope of said general formula are described in GB-P 1,439,478 and U.S. Pat. No. 3,951,660.

A toner compound particularly suited for use in combination with polyhydroxy spiro-bis-indane reducing agents like "Spirana" is 3,4-dihydro-2,4-dioxo-1,3,2H-benzoxazine described in U.S. Pat. No. 3,951,660.

The layer sequence described for the mono-sheet version is the preferred one, but, in principle, the positions of layers (2) and layers (4) can be reversed.

In case of the two-sheet version an adhesive substance, preferably a thermoadhesive polymer is present in layer (6') containing the reducing agent. Useful thermoadhesive polymers are styrene-butadiene latices. These latices can contain other comonomers which improve the stabilitity of the latex, such as acrylic acid, methacrylic acid and acrylamide. Other possible polymer latices include polyvinylacetate, copoly (ethylene-vinylacetate), copoly(acrylonitrile-butadiene-acrylic acid), copoly(styrene-butylacrylate), copoly (methylmethacrylate-butadiene), copoly (methylmethacrylate-butylmethacrylate), copoly (methylmethacrylate-ethylacrylate), copolyester(terephtalic acid-sulphoisophtalic acid-ethyleneglycol), copolyester (terephtalic acid-sulphoisophtalic acid-hexanediol-ethyleneglycol). Particularly suitable thermoadhesive polymers are the BAYSTAL polymer types, marketed by Bayer AG, which are on the basis of styrene-butadiene copolymers. Different types with different physical properties are available. The styrene content varies between 40 and 80 weight %, while the amount of butadiene varies between 60 and 20 weight %; optionally a few weight % (up to about 10%) of acrylamide and/or acrylic acid can be present. Most suited are e.g. BAYSTAL KA 8558, BAYSTAL KA 8522, BAYSTAL S30R and BAYSTAL P1800 because they are not sticky at room temperature when used in a thermoadhesive layer. Other useful polymers are the EUDERM polymers, also from Bayer AG, which are copolymers comprising n.-butylacrylate, methylmethacrylate, acrylonitrile and small amounts of methacrylic acid.

Particularly preferred are copolyesters or mixtures thereof such as such as DYNAPOLL L411 ($T_g$=55° C.) and S1420 ($T_g$=−10° C.) (Hüls AG).

In the two-sheet version of the present invention a stripping layer pack (2') is coated between the temporary support (1') and the layer (3') containing the organic metal salt. This stripping layer pack preferably consists of two layers which have a weak adhesion to each other. In a preferred embodiment the first layer closest to the temporary support contains a combination of colloidal silica, such as KIESELSOL 300F (Bayer AG), and of a laponite, such as LAPONITE S (Laporte Co.), preferably in a ratio of about 75/25; the second layer is preferably a thin protective layer (about 3 μm) composed of nitrocellulose.

Having described the principal ingredients of the different layers we shall now describe the exposure and processing steps. Therefore we have to make distinction between the mono-sheet arrangement and the two sheet version.

In case of the mono-sheet version the thermal imaging medium is exposed information-wise preferably through the coated side by means of an intense laser beam. Such a laser can be an Ar ion laser, a HeNe laser, a Kr laser, a frequency doubled Nd-YAG laser, a dye laser emitting in the visual spectral region. However in the preferred embodiment where the radiation to heat converting compound is an infra-red absorbing compound the laser is an infra-red laser. Especially preferred lasers are semiconductor diode lasers or solid state lasers such as a Nd-YAG laser emitting at 1064 nm, or a Nd-YLF laser emitting at 1053 nm. Other diode lasers emit at 823 nm or at 985 nm. A series of lasers can be used arranged in a particular array. Important parameters of the laser recording are the spot diameter (D) measured at the $1/e^2$ value of the intensity, the applied laser power on the film (P), and the recording speed of the laser beam (v).

As explained above, due to the conversion of laser radiation into heat the barrier layer is ablatively destroyed in the exposed areas, and transfer of reducing agent to the organic metal salt layer can then take place inducing chemical reduction of the organic metal salt by the reducing agent. Since however at this stage the thermal reduction of the organic silver salt is usually not complete an overall heat treatment of the exposed thermal imaging element is preferred in order to obtain a sufficient optical density. An optimal overall heating lasts at least 2 s, preferably about 15 s at about 105° C. At lower temperatures the heating time is longer and vice versa. The overall heat treatment is preferably performed by pressing the thermal imaging medium against a heated metal block, e.g. an aluminium block.

In the two-sheet version the acceptor element is information-wise laser exposed preferably through the backside. Again, ablative destruction of the barrier layer occurs in the exposed parts. Then the donor element and the exposed acceptor element are laminated to each other so that transfer of reducing agent and partial reduction of the organic metal salt occur. The lamination is carried out by bringing in contact the acceptor element and the donor element, and then introducing them into the nip af a pair of heated laminator rollers under pressure. Suitable lamination temperatures are between room temperature and 80° C. Then the support (1') and part of the stripping layer pack (2') are removed by delamination. In the preferred embodiment described above the stripping layer pack splits between the layer containing the combination of colloidal silica plus laponite and the thin nitrocellulose protective layer.

The obtained heat mode image can be used as an intermediate for the UV-exposure of a UV-sensitive element, e.g., a printing plate or a silver halide contact material. In both cases the heat mode image forms an alternative for a conventional developed silver halide image-setting film. On the other hand the obtained heat mode image can be meant for direct visual inspection, e.g., in case of proofing purposes or in case of recording of radiographic information.

The following examples illustrate the present invention without however limiting it thereto.

EXAMPLES

Example 1

This example illustrates the mono-sheet version of the present invention.

(a) invention example

-preparation of samples

The following thermal imaging media (samples 1 and 2) were built up by successive coatings.

Onto a subbed polyethylene terephthalate layer the following coating solution was coated with a 40 μm coating knife:

| | |
|---|---|
| ethyl gallate | 0.75 g |
| 5,5% polyvinylalcohol | 13.6 g |
| water | 5.65 g |
| After drying the layer showed following coverages | |
| ethyl gallate | 1.5 g/m$^2$ |
| polyvinylalcohol | 1.5 g/m$^2$ |
| total dry coverage | 3.0 g/m$^2$ |

Then the coated layer was divided in two, and two different samples of barrier layers were coated with a 20 μm coating knife from following solutions respectively:

| | sample 1 | sample 2 |
|---|---|---|
| 7.54% nitrocellulose in methylethylketone (Wolff Walsrode E620) | 1.65 g | 6.7 g |
| 75% hexamethylenediisocyanate in xylene (DESMODUR N 75, Bayer AG) | 0.1 g | 0.33 g |
| 1% zinc octanoate in methylethylketone | 0.06 g | 0.12 g |
| infra-red dye ID-1a (Bayer AG) | 0.2 g | 0.3 g |
| infra-red dye ID-1b (Bayer AG) | 0.3 g | 0.45 g |
| methylethylketone (MEK) | 7.7 g | 2.1 g |

After drying the barrier layer showed following coverages (g/m$^2$):

| | sample 1 | sample 2 |
|---|---|---|
| nitrocellulose | 0.25 | 1.0 |
| hexamethylenediisocyanate | 0.15 | 0.5 |
| zinc octanoate | 0.0012 | 0.0024 |
| infra-red dye ID1a + ID1b | 1.0 | 1.5 |
| total dry coverage | 1.4 | 3.0 |

The layer was hardened at 120° C. for 1 hour.

Then onto both samples an identical silver behenate layer was coated with a 100 μm knife from a solution containing:

| | |
|---|---|
| 10.35% BUTVAR B79 (Monsanto) + 11.25% silver behenate dispersion | 50 g |
| succinimide | 0.5 g |
| MEK | 49.5 g |
| The dried layer showed following coverages: | |
| silver behenate | 5.6 g/$m^2$ |
| BUTVAR B79 | 5.2 g/$m^2$ |
| succinimide | 0.5 g/$m^2$ |
| total dry coverage | 11.3 g/$m^2$ |

-exposure step

The prepared samples were exposed (sample 1 two different exposures, sample 2 just one) by full area scanning with following specifications:

sample 1a: diodelaser emitting at 830 nm; external drum; exposure through the coated side; spot diameter 9.6 μm; drum speed 1.1 m/s; power on film 120 mW; resolution 3400 dpi (pitch 7.5 μm);

sample 1b and 2: NdYLF laser emitting at 1053 nm; external drum; exposure through the coated side; spot diameter 14.9 μm; drum speed 2.2 m/s; power on film 400 mW; resolution 3400 dpi (pitch 7.5 μm).

-processing and evaluation

After exposure the transmission densities at Dmin and Dmax were measured using a MacBeth TD904 spectrophotometer equiped with a UV filter. Then the samples were subjected to an overall heat treatment, being a contact of the back side with an aluminium block heated at 105° C. for 15 seconds. The Dmin and Dmax values were measured again.

The Dmin and Dmax values before and after heat treatment are represented in table 1.

TABLE 1

| | before heat treatment | | after heat treatment | | |
|---|---|---|---|---|---|
| sample | Dmin | Dmax | Dmin | Dmax | ΔDmax |
| 1a | 0.8 | 1.6 | 0.9 | 2.9 | +1.3 |
| 1b | 0.79 | 2.78 | 0.89 | 3.22 | +0.44 |
| 2 | 1.4 | 3.2 | 1.4 | 3.5 | +0.3 |

The results illustrate that the stronger the laser used (sample 1b and 2) the higher Dmax is obtained which is only slightly enhanced by an overall heat treatment. In the case of a weaker laser the heat post-treament is necessary in order to obtain a sufficient Dmax.

(b) comparative example

It is difficult to construct a perfectly straightforward comparative example without barrier layer since an infra-red dye must be present anyway in some layer in order to convert the laser radiation into heat. Therefore, three different comparison samples were prepared with following specifications:

-comparison sample A: no IR dye present.

-comparison sample B: IR dye in the reducing agent containing layer. Since however IR-1a and IR-1b are insoluble in the hydrophylic coating composition of this layer, a water-soluble IR dye (formula see below) was chosen and incorporated at a suitable coverage of 0.15 g/$m^2$.

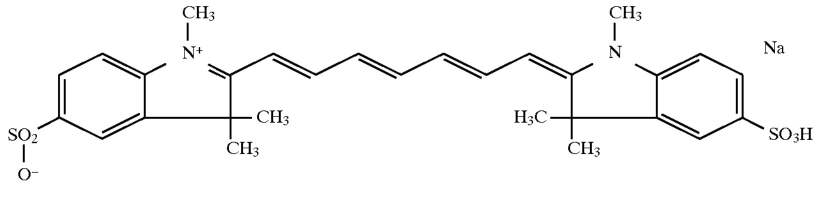

-comparison sample C: IR dye in the silver behenate layer; in this case the same IR-1a+IR-1b could be used as in the invention samples.

The three comparison samples and invention sample 1 were subjected to a thermal treatment (15 s/105° C.) without being laser exposed, and to an accelerated ageing test simulating shelf life behaviour (72 h/60° C.). The obtained densities (UV) are represented in table 2.

TABLE 2

| sample | after coating | after 15 s/105° C. | after 72 h/60° C. | :ΔD |
|---|---|---|---|---|
| comp. A | 0.09 | 1.50 | 0.13 | 0.04 |
| comp. B | 0.17 | 1.49 | 0.25 | 0.08 |
| comp. C | 0.71 | 2.43 | 0.98 | 0.27 |
| inv. 1 | 0.79 | 0.89 | 0.80 | 0.01 |

It is clear from table 2 that the density increase for the invention sample with barrier layer is much lower compared to the density increase of the comparison samples both for the thermal treatment test and for the accelerated ageing test.

Other test samples were exposed to a full area scanning exposure (cf. invention samples 1b and 2). The obtained Dmax and Dmin values (UV) are represented in table 3.

TABLE 3

| | without thermal post-treatment | | | with thermal post-treatment | | | |
|---|---|---|---|---|---|---|---|
| sample | Dmax | Dmin | ΔD | Dmax | Dmin | ΔD | ΔDmax |
| comp. A | 0.09 | 0.09 | 0.00 | 1.62 | 1.62 | 0.00 | 1.53 |
| comp. B | 0.18 | 0.18 | 0.00 | 1.64 | 1.64 | 0.00 | 1.46 |
| comp. C | 1.87 | 0.77 | 1.10 | 2.81 | 2.21 | 0.60 | 0.94 |
| inv. 1b | 2.78 | 0.79 | 1.99 | 3.22 | 0.89 | 2.33 | 0.44 |

As is clear from table 3 the comparison samples show a bad image differentiation. On the contrary the invention sample shows a good density contrast even without thermal treatment and this contrast is enhanced by the thermal treatment since Dmax is increased without significant increase in Dmin.

Example 2

This example illustrates the two-sheet version of the present invention.

-preparation of sample

An acceptor element was prepared as follows. Onto a 100 μm thick subbed polyethylene terephthalate support a stripping layer pack was applied consisting of a first layer containing a mixture of KIESELSOL 300F (Bayer AG) and LAPONITE S (Laporte Co.) and a second layer composed of 3 μm thick nitrocellulose coated from a mixture of methanol/ethanol/propanol (0.85/1.0/0.15). Both layers showed a weak adhesion to each other.

Then a silver behenate layer was coated with a 100 μm knife from following composition (cf. example 1):

| | |
|---|---|
| 10.35% BUTVAR B79 (Monsanto) + 11.25% silver behenate dispersion | 50 g |
| succinimide | 0.5 g |
| solvents | 49.5 g |
| The dried layer showed following coverages: | |
| silver behenate | 5.6 g/$m^2$ |
| BUTVAR B79 | 5.2 g/$m^2$ |
| succinimide | 0.5 g/$m^2$ |
| total dry coverage | 11.3 g/$m^2$ |

Then a barrier layer was coated with a 40 μm knife from following composition:

| | |
|---|---|
| 7.5% nitrocellulose (Wolff Walsrode E620) | 1.5 g |
| infra-red dye ID-1a (Bayer AG) | 0.1 g |
| infra-red dye ID-1b (Bayer AG) | 0.15 g |
| methanol | 18.25 g |
| The dried layer showed following coverages: | |
| nitrocellulose | 3.0 g/$m^2$ |
| IR dyes ID-1a + ID-1b | 0.5 g/$m^2$ |
| total dry coverage | 3.5 g/$m^2$ |

A donor element was prepared as follows. Onto a subbed 100 μm thick polyethylene terephthalate support a layer was coated with a 20 μm knife from the following composition:

| | |
|---|---|
| dodecyl gallate | 2.4 g |
| thermoadhesive copolyester Dynapoll L411 | 1.8 g |
| thermoadhesive copolyester Dynapoll S1420 | 1.8 g |
| toluene/ethylacetate 70/30 | 17 g |
| The dried layer showed following coverages: | |
| dodecyl gallate | 2.1 g/$m^2$ |
| copolyester | 3.1 g/$m^2$ |
| total dry coverage | 5.2 g/$m^2$ |

-exposure step

The acceptor was exposed through its backside by full area scanning exposure under the following specifications: NdYLF laser emitting at 1053 nm; external drum; spot diameter 14.9 μm; drum speed 2.2 m/s; power on film 400 mW; resolution 3400 dpi (pitch 7.5 μm).

-processing and evaluation

After exposure through the backside of the acceptor the donor element was laminated to the acceptor in a CODOR LAMIPACKER LPP650 under following conditions: 80° C. for upper and under roller; lamination speed 100 cm/min.

Then the PET support of the acceptor element was delaminated whereby separation occurred between the first layer of the stripping pack being the colloidal silica + laponite layer and the second layer of the stripping pack being the thin nitrocellulose layer. The Dmax and Dmin of the remaining layer arrangement were measured and finally this layer pack subjected to an overall heat treatment, being a contact of the backside with a aluminium block heated at 105° C. for 15 seconds. The Dmin and Dmax values were measured again.

The Dmin and Dmax values before and after heat treatment are represented in table 4.

TABLE 4

| | before heat treatment | | after heat treatment | | |
|---|---|---|---|---|---|
| sample | Dmin | Dmax | Dmin | Dmax | ΔDmax |
| invention | 0.4 | 0.8 | 0.4 | 2.4 | +1.6 |

The results of table 4 indicate that in case of the two-sheet version an overall heat post-treatment is indispensable in order to obtain a sufficient Dmax.

We claim:

1. Method for obtaining a heat mode image comprising the following steps:

(A) exposing information-wise to laser radiation a thermal imaging medium comprising the following layers:

(1) a transparent support, optionally subbed, (2) a layer comprising a reducing agent and a binder, (3) a barrier layer destructible by heat and preventing the diffusion of said reducing agent to following layer (4) before said laser exposure, and comprising a compound capable of converting laser radiation into heat, (4) a layer containing a reducible organic metal salt, a binder and optionally a toning agent, said laser exposure inducing destruction of said barrier layer (3) in the exposed parts and at least partial transfer of said reducing agent of layer (2) into said layer (4), while no destruction and no transfer occur in the unexposed parts, and (B) optionally subjecting said exposed thermal imaging medium to an overall heat treatment.

2. Method according to claim 1 wherein said barrier layer (3) contains nitrocellulose.

3. Method according to claim 2 wherein said nitrocellulose is hardened by a cross-linking reaction induced by a heat treatment.

4. Method according to claim 3 wherein said cross-linking reaction is performed in the presence of an isocyanate incorporated in said barrier layer (3).

5. Method according to claim 4 wherein said isocyanate is hexamethylenediisocyanate.

6. Method according to claim 1 wherein said reducible organic metal salt of layer (4) is an organic silver salt.

7. Method according to claim 6 wherein said organic silver salt is silver behenate.

8. Method according to claim 1 wherein said binder of layer (4) is polyvinylbutyral.

9. Method according to claim 1 wherein said optional toning agent of layer (4) is succinimide.

10. Method according to claim 1 wherein said reducing agent of layer (2) is a gallic acid ester.

11. Method according to claim 1 wherein said information-wise exposure to laser radiation is performed by an infra-red laser and said compound capable of converting laser radiation into heat is an infra-red absorbing compound.

12. Method for obtaining a heat mode image comprising the following steps (A') exposing information-wise to laser radiation an acceptor element comprising the following layers,:

(1') a temporary transparent support, optionally subbed, (2') a stripping layer pack, (3') a layer containing a reducible organic metal salt, a binder and optionally a toning agent, (4') a barrier layer destructible by heat, and comprising a compound capable of converting laser radiation into heat, whereby destruction of said barrier layer occurs in the exposed areas, (B') providing a donor element comprising the following layers (5') a transparent support, optionally subbed, (6') a layer containing a reducing agent and a (thermo) adhesive polymer, (C') laminating acceptor element (A') and donor element (B') to each other, layers (4') and (6') facing each other, (D') removing temporary transparent support (1') and at least part of stripping layer pack (2') by delamination, (E') subjecting the resulting layer pack to an overall heat treatment.

13. Method according to claim 12 wherein said barrier layer (4') contains nitrocellulose.

14. Method according to claim 12 wherein said reducible organic metal salt of layer (3') is an organic silver salt.

15. Method according to claim 14 wherein said organic silver salt is silver behenate.

16. Method according to claim 12 wherein said binder of layer (3') is polyvinylbutyral.

17. Method according to claim 12 wherein said optional toning agent of layer (3') is succinimide.

18. Method according to claim 12 wherein said reducing agent of layer (6') is a gallic acid ester.

19. Method according to claim 12 wherein said information-wise exposure to laser radiation is performed by an infra-red laser and said compound capable of converting laser radiation into heat is an infra-red absorbing compound.

20. Method according to claim 12 wherein said stripping layer pack (2') is a two-layer pack, the two layers of which have a weak adhesion for each other.

21. Method according to claim 20 wherein said two-layer pack comprises a first layer containing colloidal silica and a laponite, and the second layer is composed of nitrocellulose.

22. A thermal imaging medium as defined in claim 1.

* * * * *